United States Patent
Bhardwaj et al.

(10) Patent No.: US 9,136,811 B2
(45) Date of Patent: Sep. 15, 2015

(54) AUTOMATIC GAIN CONTROL (AGC) FOR MULTICHANNEL/WIDEBAND COMMUNICATIONS SYSTEM

(71) Applicant: Edgewater Wireless Systems Inc., Kanata, Ontario (CA)

(72) Inventors: Manish Bhardwaj, Cambridge, MA (US); Garret Shih, Brookline, MA (US)

(73) Assignee: Edgewater Wireless Systems Inc., Kanata (CA)

( * ) Notice: Subject to any disclaimer, the term of this patent is extended or adjusted under 35 U.S.C. 154(b) by 0 days.

(21) Appl. No.: 13/846,285

(22) Filed: Mar. 18, 2013

(65) Prior Publication Data

US 2013/0279635 A1    Oct. 24, 2013

Related U.S. Application Data

(63) Continuation of application No. 11/472,797, filed on Jun. 22, 2006, now abandoned, which is a continuation-in-part of application No. 11/357,910, filed on Feb. 17, 2006, now abandoned, which is a continuation of application No. 11/190,071, filed on Jul. 26, 2005, now abandoned.

(60) Provisional application No. 60/591,381, filed on Jul. 26, 2004.

(51) Int. Cl.
| | |
|---|---|
| *H04B 1/06* | (2006.01) |
| *H04L 27/26* | (2006.01) |
| *H04B 1/10* | (2006.01) |
| *H03G 3/20* | (2006.01) |
| *H03G 3/30* | (2006.01) |
| *H04L 5/06* | (2006.01) |

(52) U.S. Cl.
CPC ............ *H03G 3/20* (2013.01); *H03G 3/3036* (2013.01); *H04L 5/06* (2013.01)

(58) Field of Classification Search
CPC ............ H03G 3/20; H03G 1/00; H03G 3/00; H04B 1/06; H04B 1/10; H04L 27/26
USPC .......... 455/232.1, 234.1–234.2, 239.1, 240.1, 455/241.1, 245.2, 247.1, 246.1, 250.1; 375/148, 345
See application file for complete search history.

(56) References Cited

U.S. PATENT DOCUMENTS

| | | | |
|---|---|---|---|
| 5,179,730 A | 1/1993 | Loper | |
| 6,363,262 B1 | 3/2002 | McNicol | |
| 6,838,937 B2 * | 1/2005 | Fanous et al. | 330/124 R |
| 7,065,165 B2 * | 6/2006 | Heinonen et al. | 375/345 |
| 7,088,975 B1 * | 8/2006 | Gomez et al. | 455/232.1 |
| 2004/0151264 A1 * | 8/2004 | Montojo et al. | 375/345 |

\* cited by examiner

*Primary Examiner* — Blane J Jackson
(74) *Attorney, Agent, or Firm* — Hamilton Brook, Smith & Reynolds, P.C.

(57) ABSTRACT

Automatic Gain Control (AGC) system for multi-channel signals attenuates an incoming multi-channel signal by providing a gain. The system further adjusts each individual channel, of the multi-channel signal, by supplying a second gain if needed. The AGC system is designed to ensure a received signal power is at an optimal level for analog to digital conversion or any other form of signal processing. The system also enables elimination of mid-packet gain adjustments.

27 Claims, 5 Drawing Sheets

AUTOMATIC GAIN CONTROL (AGC) FOR MULTICHANNEL/WIDEBAND COMMUNICATIONS SYSTEM

RELATED APPLICATIONS

This application is a continuation of U.S. application Ser. No. 11/472,797, filed Jun. 22, 2006, which is a continuation-in-part of U.S. application Ser. No. 11/357,910, filed Feb. 17, 2006, which is a continuation of U.S. application Ser. No. 11/190,071 filed Jul. 26, 2005, which claims the benefit of U.S. Provisional Application No. 60/591,381, filed on Jul. 26, 2004. The entire teachings of the above applications are incorporated herein by reference.

BACKGROUND OF THE INVENTION

Analog to digital conversion is a commonly used technique wherein a continuous signal is converted to a digital signal for the purpose of signal processing. An analog to digital converter (ADC) is often used for such a conversion. ADCs typically have a limited number of bits available, and thus a limited conversion range, to perform analog to digital conversions. Automatic gain control (AGC) is therefore used to adjust the power level of an incoming signal such that the ADC will receive signals at a fixed level; thus, the number of bits required by the ADC to perform conversions may be dramatically reduced. The AGC controls the gain of a system in order to maintain an adequate performance over a range of input signal levels.

Gain will be discussed herein in terms of decibels (dB). A dB is typically used to describe the ratio between two measurements of electrical power, which may be arithmetically added and subtracted. A dBm represents an absolute unit of electrical power. A dBm may be defined as $A=10*\log 10(P2/(1mW))$, where A is the absolute unit of power and $P2$ is a measurement of electrical power. The ratio of power may be defined as $P2/(1mW)=10^{(A/10)}$. For example, 1 dBm is one dB greater than 0 dBm, or about 1.259 mW ($1.259=10^{1/10}$).

A canonical form of a conventional AGC scheme in a digital communications system 100, is illustrated in FIG. 1. The system 100 comprises a Variable Gain Amplifier (VGA) 103, that receives an input signal 101. The AGC 105 receives a digital signal 106, digitized via an ADC 107. The AGC 105 supplies information to the VGA 103 via a feedback connection 104. The information supplied by the AGC 105 is used in adjusting the gain supplied to the input signal 101. It should be appreciated that the gain adjustment affects the average total power of the signal and not the instantaneous power of the signal. Thus, the gain adjusted signal will still comprise its unique signal properties since its instantaneous power will be intact. A modem 109 is typically used to demodulate the signal in order to produce bits 113.

As discussed above, when designing a digital communication system, the dynamic range must be put into consideration. The dynamic range of the input signal may be extremely large; 802.11 modems typically support close to 90 dB of dynamic range. Area and power requirements for an ADC typically increases by four times every 6 dB. Hence, a large ADC dynamic range is extremely expensive.

A solution for this problem, as previously mentioned, is to reduce the dynamic range seen at the ADC by performing automatic gain control. An ideal AGC switches in the right amount of analog gain such that the signal power at its output A, FIG. 1, is always the same, regardless of the input signal level. Hence, an ideal AGC completely eliminates signal dynamic range. Thus, the AGC is essential in such a system as it controls the gain of an incoming signal in order to bring the signal to a suitable level for conversion or any other form of signal processing.

As an example, consider a system that must receive single channel signals from −100 dBm to −10 dBm, 90 dB of dynamic range. To accommodate this range, a VGA is used that must be set to 0 through 90 dB of gain. Therefore, for a signal which is (−10−X) dBm, X dB of gain is typically switched into the signal. Using this technique the output always stays at −10 dBm. Otherwise, assuming 1 bit is required to convert a 6 dB analog signal to a digital signal, a maximum of 15 bits would be needed to convert a −90 dBm signal. A conversion requiring 15 bits is technically very difficult. Thus, if a −40 dBm signal arrives in the system, 30 dB of gain is added to the signal in order to obtain the optimum value, dramatically reducing the amount of bits required for the conversion.

One way of building such an AGC is to simply cycle through all possible gain settings, for example in 2 dB steps, and stop when the desired signal level is reached. One might choose to use a binary search instead of a linear one to increase the speed of the acquisition.

SUMMARY OF THE INVENTION

A system and method for automatically providing gain adjustments to a multi-channel signal and gain adjustments to an individual channel, of the multi-channel signal, is discussed. The system comprises a multi-channel receiver, the receiver further comprising an outer programmable gain controller, controlling gain of a multi-channel signal, and a plurality of inner programmable gain controllers, each inner gain controller controlling gain of a respective individual channel. The multi-channel receiver further comprises an analog to digital converter to digitize the gain controlled multi-channel signal, and each respective individual channel further comprises a digital filter.

The outer gain controller may receive feedback from each respective channel to adjust gain values and determine whether a signal is being processed. The feedback may be provided by a modem or an analyzer. The outer gain controller may supply a fixed nominal gain while an acquisition threshold power level or a high threshold power level is not exceeded. Once an acquisition threshold power level or a high threshold power level is exceeded, the outer gain controller adjusts the gain such that a total power is brought below the acquisition threshold. The inner and outer gain controllers may be either digital or analog.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

Many problems arise when using prior art methods of automatic gain control for multi-channel signals. Multi-channel systems, also referred to as wideband systems, simultaneously support multiple physical layer channels. As an example, the case when such channels are frequency separated will be specifically discussed, but it should be appreciated that such separation may also be along other dimensions, for example, orthogonal signatures. It should be understood that these channels typically overlap in time and are separable along some other dimension.

Figure 1:
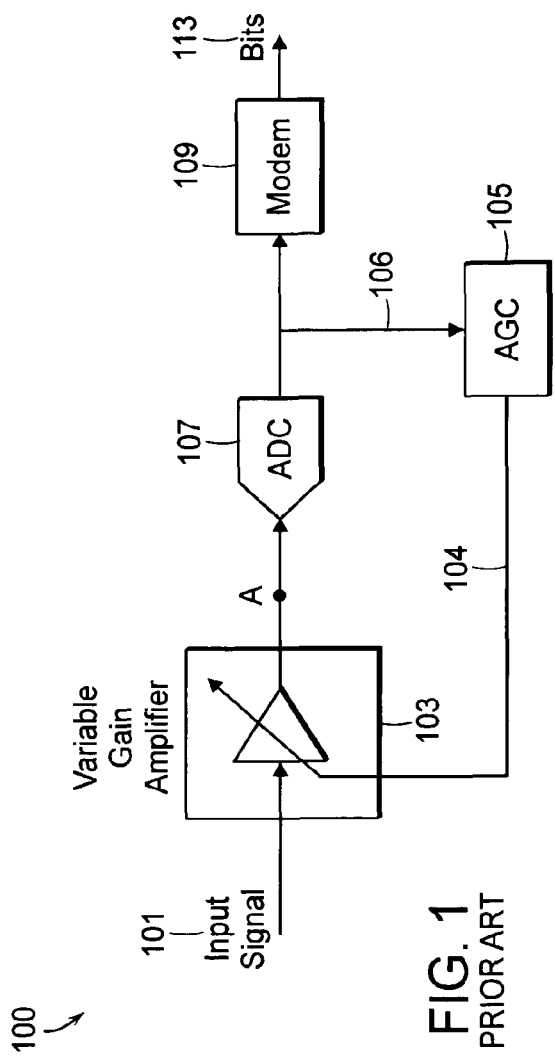
FIG. 1 is a schematic of a conventional AGC scheme in a digital communication system.
Figure 2:
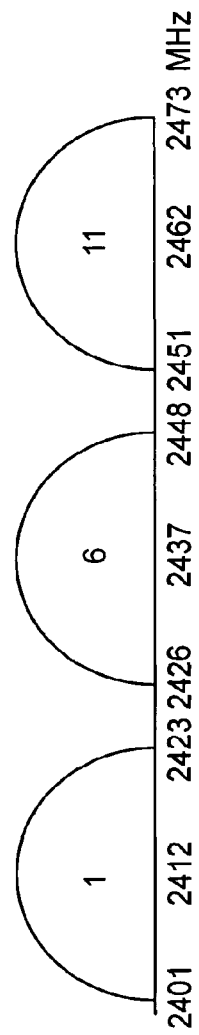
FIG. 2 is a depiction of a multi-channel signal.
Figure 3:
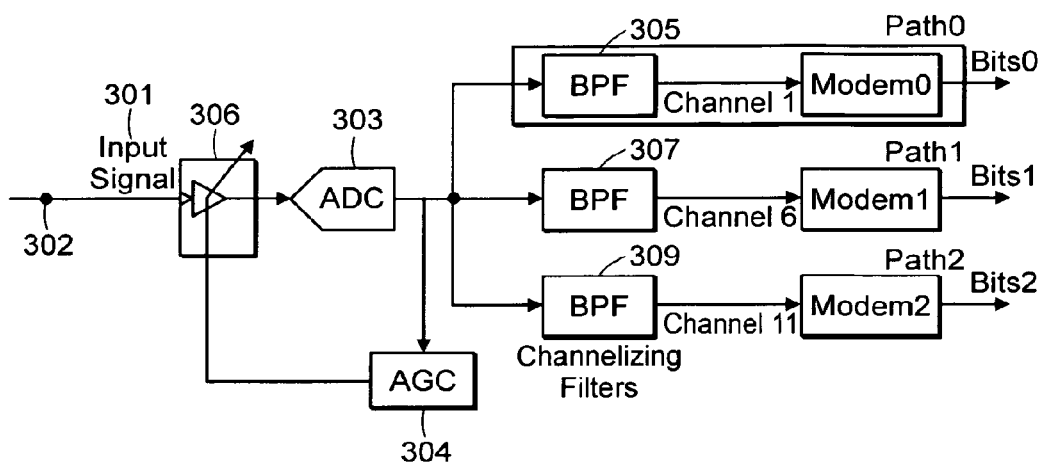
FIG. 3 is a schematic of a multi-channel digital communication system.

An example of a multi-channeled system is illustrated in FIG. 2. FIG. 2 displays a three 802.11g channel (1, 6, and 11) signal in a 2.4 GHz ISM band. An overall block diagram of a system, which may support such a signal, is shown in FIG. 3. An analog multi-channel input signal 301 is digitized with the use of an ADC 303. An AGC 304, along with a VGA 306, is used to adjust the gain of the multi-channel signal. The multi-channel signal is then filtered into individual channels 1, 6, and 11, with the use of Band Pass Filters (BPF) 305, 307 and 309, respectively. Modems 0-2 demodulate the individual channels 1, 6, and 11 into bits 0-2, respectively.

A problem in an integrated multi-channel system is that, while multiple channels are received at different power levels and hence have different optimal gain settings, they are forced to share a common gain. Therefore, we provide a technique to resolve the inevitable conflicts that result, such as mid-packet gain adjustments.

First, a two packet arrival scenario is presented to illustrate deficiencies of conventional AGCs in a multi-channel system. Consider the packet arrival scenario depicted in FIG. 4, for the communication system shown in FIG. 3. When packet 1 arrives at −20 dBm, the AGC will attenuate the power level of packet 1 down by 10 dB. Hence, post AGC, packet 1 will comprise a power level of −30 dBm, as is desired. When packet 2 arrives with a power level of −40 dBm, the optimal gain for packet 2 will be 10 dB but it instead sees a downward attenuation of 10 dB, thus resulting in packet 2 comprising a power level of −50 dBm. This is 20 dB away from the desired power level. With the arrival of packet 2, the AGC 304 and VGA 306 will see a slight increase to the total power of the system from −20 dBm to −19.96 dBm at point 302, during time 1. Once the first packet ends, the total power of the system, at point 302, is significantly dropped to −40 dBm at time 2; thus the amount of gain applied to the system must be significantly increased as packet 1 leaves the system but while packet 2 is still being processed. Thus, packet 2 will see a mid-packet gain change.

Figure 5:
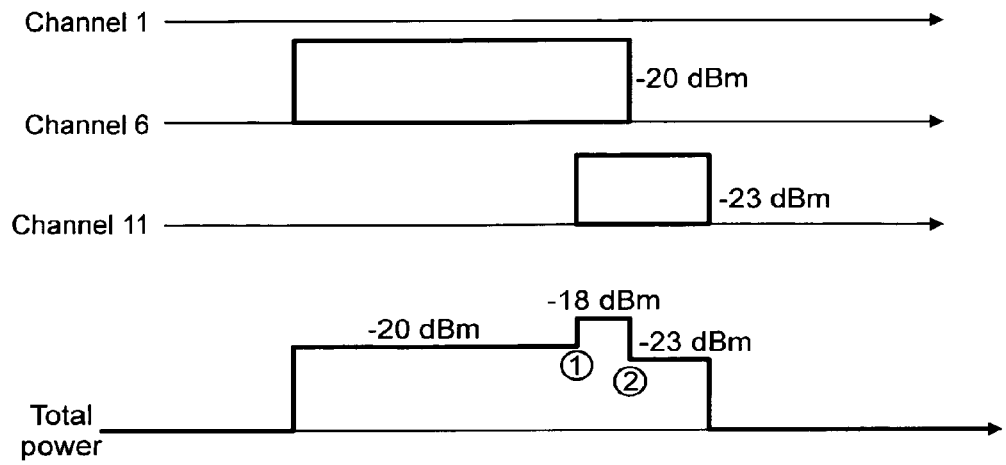
FIG. 5 is a graphical depiction of a second dual packet arrival example according to the system shown in FIG. 3.

Now consider the same scenario as described above except that the second packet arrives at −23 dBm, as shown in FIG. 5. As was the case in the previous example, packet 1 will receive a downward attenuation of 10 dB, resulting in its power level to be increased to −30 dBm. The arrival of the second packet will result in the overall total power, at point 302, being increased to about −18 dBm at time 1. Hence, in order to keep the desired −30 dBm total power level, the AGC would have to switch the downward attenuation of packet 2 from 10 dB to 12 dB in the middle of packet 1 (1). This type of mid-packet gain change could be catastrophic for packet 1. Finally, consider the AGC behavior when the first packet ends at time 2. The power at point 302 now drops by 5 dB to −23 dBm and the AGC switches the downward attenuation from 12 dB to 7 dB. This gain change is also catastrophic for packet 2.

Figure 6:
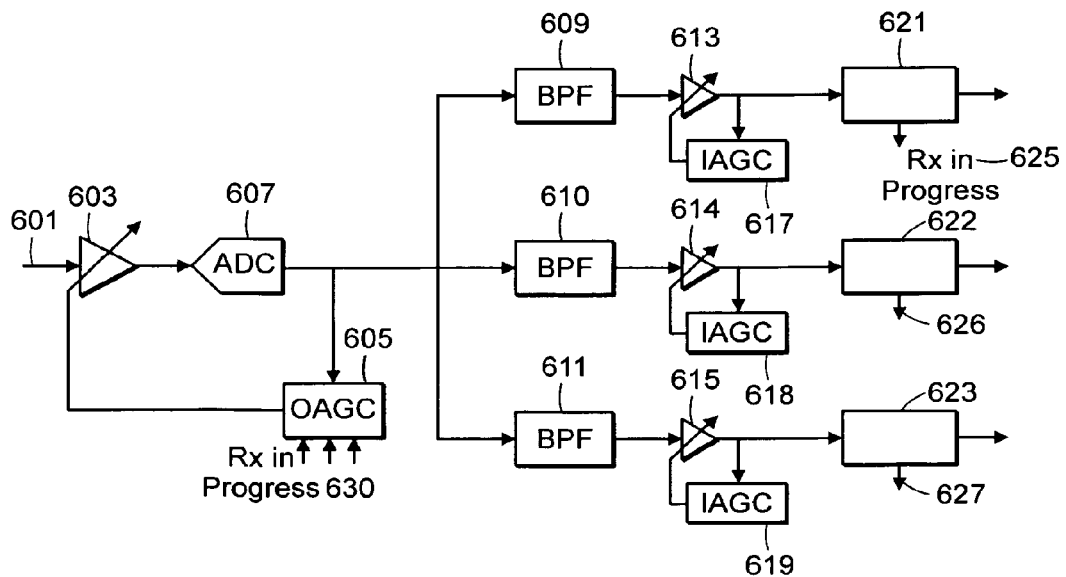
FIG. 6 is a schematic of a multi-channel digital communication system, according to an aspect of the present invention.

A system is needed that will provide the desired gain adjustments for multi-channel signals, while minimizing mid-packet gain changes. A block diagram of a wideband AGC scheme, according to one embodiment of the present invention, is shown in FIG. 6. A multi-channel input signal 601 is adjusted in gain with the use of an outer VGA 603. A common analog outer automatic gain controller (OAGC) 605 provides information to the VGA 603 used to continuously adjust the gain of the multi-channel input signal 601. The OAGC operates on the sum of the three channel powers and cannot, for instance, distinguish between signals traveling on different channels.

The functionality of OAGC may be described as a two state machine. The first state of the OAGC is called the HUNT state. While the OAGC is in the HUNT state, a fixed, nominal analog gain is applied. The OAGC stays in this state until the power in the band differs from an acquisition threshold, or the desired power level, and if the power level of the incoming signal is within the operating range of the OAGC. When this happens, the OAGC adjusts the analog gain such that the total power level is brought down to the level of the acquisition threshold, and the OAGC transitions to a second state, the LOCKED state. Thus, the OAGC attenuates the incoming signal.

Figure 7:
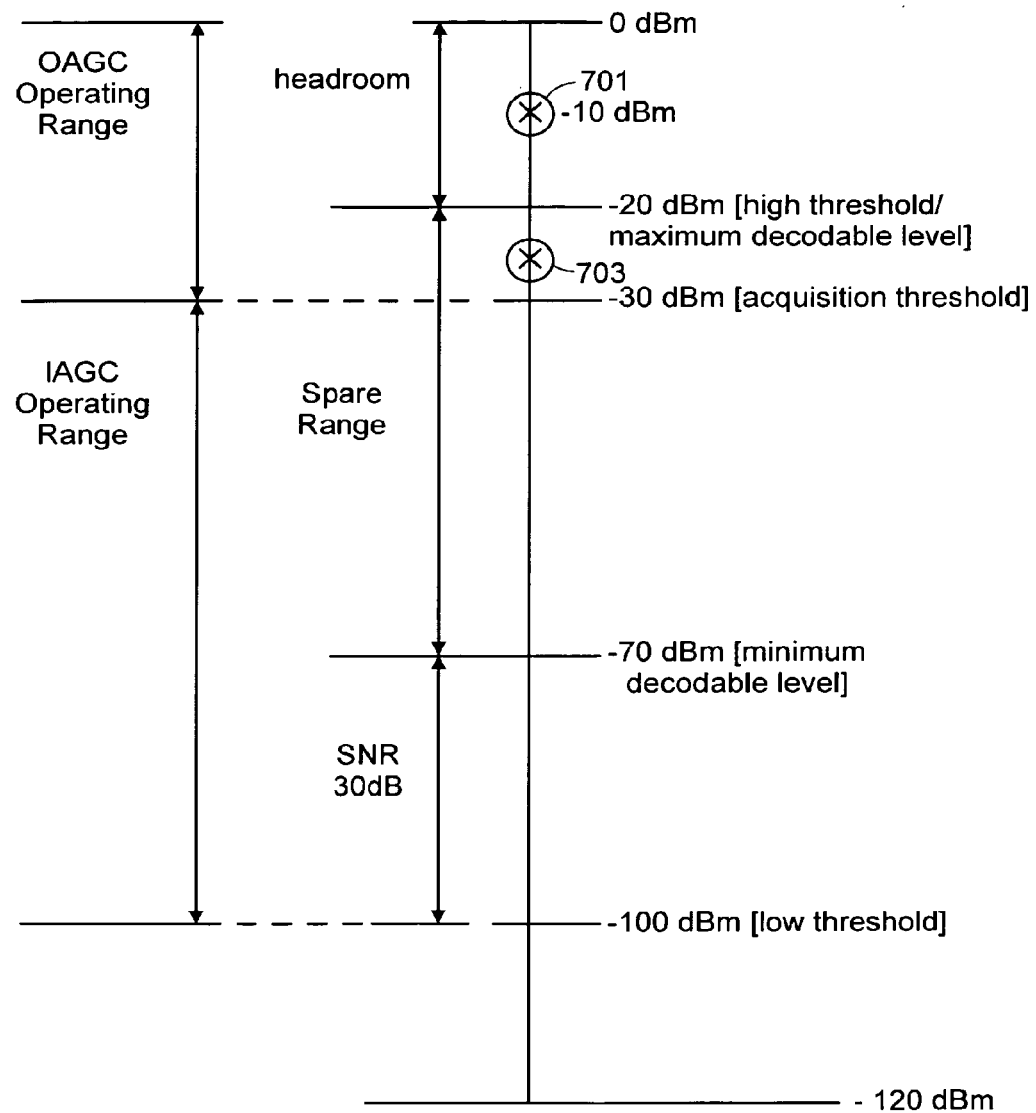
FIGS. 7 and 8 are an example depicting the function of the multi-channel digital communication system, according to an aspect of the present invention.

As an example, shown in FIG. 7, an acquisition level is set to −30 dBm. Packet 1 arrives first at −10 dBm, 701, well within the headroom. Signals that are received in the headroom range are often clipped, therefore these signals must be brought down to the spare range, or the range in which the signal may be successfully decoded. Thus the OAGC will attenuate the signal downward by 20 dB in order to bring the total power level of packet 1 to −30 dBm. The OAGC then transitions into a LOCKED state and will therefore supply a fixed downward attenuation of 20 dB to all incoming signals until one of two events occur: (1) if the power exceeds a high threshold, the OAGC adjusts the gain such that the power level is brought down to the acquisition threshold and it continues to stay in the LOCKED state; or (2) if the power drops below a low threshold and if none of the modems are receiving a packet, the OAGC transitions to the HUNT state. In FIG. 6, the 'Rx in Progress' signal, one per channel, is used to communicate whether a modem is receiving a packet.

As seen in the example provided by FIG. 7, a second packet 2 arrives with a power level of −25 dBm, 703. With the arrival of packet 2, the system will see an overall power level increase from −10 dBm to −9.87 dBm. Since the increase in the total power is so slight and does not exceed the high threshold, the system will remain in the LOCKED state. The OAGC will therefore supply a downward attenuation of 20 dB to both packets resulting in packet 2 comprising a total power level of −45 dBm. Packet 2 is now within the maximum (−20 dBm) and minimum (−70 dBm) decodable level range, but is 15 dB away from the acquisition level (−30 dBm).

Upon receiving the analog gain adjustments, the multi-channel input signal 601 is then digitized with the use of an ADC 607. BPFs 609-611 filter the multi-channel signal 601 into individual channels. In order to fully utilize the word length of the digital signal in the individual channels, the individualized digital signal may be further adjusted in order to bring the signal to the acquisition power level. The gain of the individual channels are digitally adjusted, if needed, with the use of inner VGAs 613-615. Inner automatic gain controllers (IAGC) 617-619 provide information to the inner VGAs 613-615, respectively, used to adjust the gain of the individual channels.

Functionally, inner AGCs are similar to conventional AGCs, with one difference being that they are entirely digital (there is no analog gain to control). Each channel comprises its own IAGC which operates on the output of the channelizing filter. The IAGCs operate on a single parameter, the desired reference level. When the input signal to the IAGC differs from the reference level, the digital gain is adjusted to correct for that difference.

In the example provided by FIG. 7, once packet 1 is filtered into its individual channel, the IAGC will not digitally adjust its gain since the power level of packet 1 is already at the acquisition level (−30 dBm). Once packet 2 is filtered into its individual channel, the IAGC will add 15 dB of gain in order to bring the power level of packet 2 to the acquisition level. The digital adjustment of packet 2 is completely independent of the processing done to packet 1. Thus, each packet may have its gain individually adjusted, eliminating mid-packet gain adjustments.

The individual channels are then demodulated with the use of modems 621-623. The modems 621-623 also provide feedback to the common OAGC identifying if a packet is being processed. It should also be appreciated that feedback may be provided with the use of other devices, for example, an end point analyzer.

Figure 4:
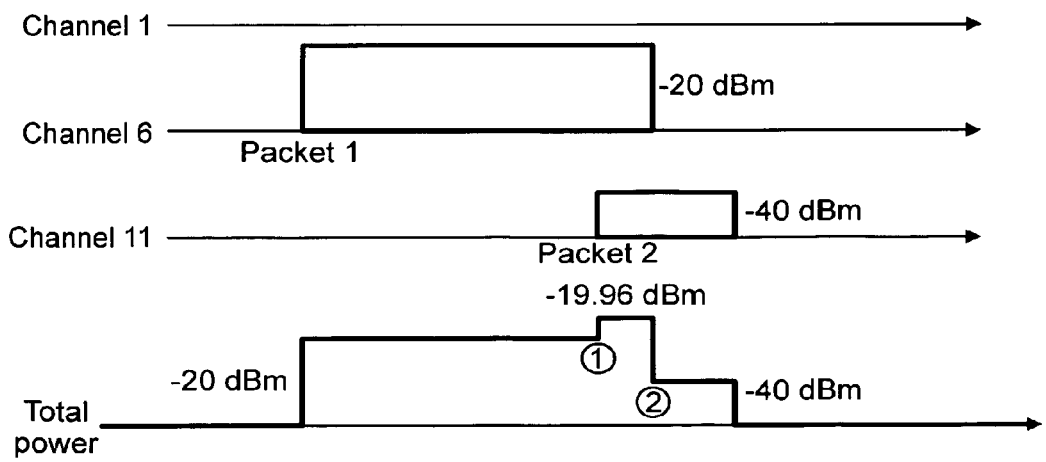
FIG. 4 is a graphical depiction of a dual packet arrival example, according to the system shown in FIG. 3.

Considering the two packet scenario, depicted in FIG. 4, in relation to the present invention, mid-packet gains are no longer an issue. The first packet is handled in a similar manner with the present invention, as would be with a conventional AGC. A downward attenuation of 10 dB is applied to the input signal comprising packet 1 (initially comprising a power level of −20 dBm); therefore, the desired power level of −30 dBm is achieved. The OAGC has therefore adjusted the analog gain such that the total power is brought to the acquisition threshold (−30 dBm) and will then transition to the LOCKED state. Since the power of packet 1 is already at its desired level, the IAGC for path 1 will not need to adjust its gain.

When packet 2 arrives, the total power level of the system will be increased from −20 dBm to about −19.96 dBm at time 1, given that this is a minimal increase in power, it will probably not be significant enough to cross the high threshold. Hence, the OAGC will stay in the LOCKED state and a downward attenuation of 10 dB will also be added to packet 2. Thus, packet 2 will now comprise a power level of −50 dBm. The IAGC of the individual channel comprising packet 2, will adjust the gain and bring the −50 dBm packet up to −30 dBm by adding 20 dB of gain. Of course, the ADC must have enough spare dynamic range to support the digitization of the −50 dBm signal.

When the −20 dBm signal ends, the OAGC will notice a 20 dB drop in power, which may take it below the low threshold. However, the modem on the individual channel comprising packet 2, will indicate that a receive is in progress and the OAGC will wait for that to finish before transitioning back to the HUNT state. Thus, as may be seen from the above example, the OAGC acts as an attenuator and shifts the incoming signal downward, while the IAGC supplies a gain to the individual channels in order to raise the signal to the acquisition level.

The values of the maximum and minimum thresholds, acquisition, and maximum and minimum decodable levels are determined by system requirements. The acquisition threshold may be set as in conventional AGCs. It is simply the desired signal level one wishes to see at the ADC input. The high threshold should be set higher than the acquisition threshold plus the single sided OAGC acquisition error but no higher than the tolerable saturation limit. The low threshold should be set lower than the acquisition threshold minus the single sided AGC acquisition error. A problem in setting the low threshold too low is that the OAGC will not unlock even after the packet that caused the AGC is finished.

Due to several noise sources that affect signal power estimation and gain control, practical AGCs always have a finite acquisition error. So an AGC with +/−1 dB of acquisition error guarantees that the output of the variable gain stage will be correct to within that tolerance if the input is within the specified dynamic range.

Figure 8:
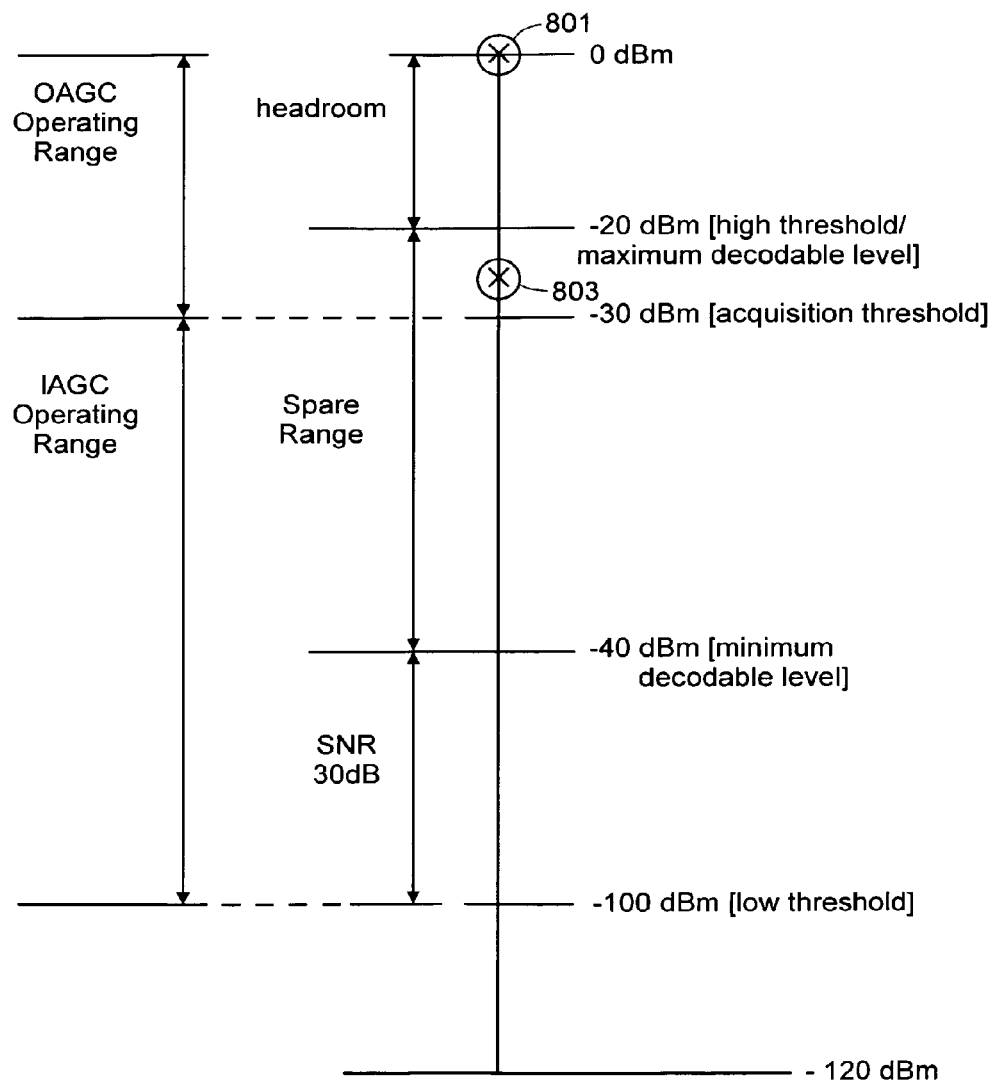

When selecting the value of the threshold levels, it is useful to examine statistical data to determine the range where most of the incoming signals will fall. The solution presented is not a perfect solution as there are occasions where a packet may be dropped or saturated, as is shown in FIG. 8. In the example provided by FIG. 8, a first packet 1 arrives with a power level of 0 dBm, 801, thus the OAGC will a downward attenuation of 30 dB to packet 1 and then transition into the LOCKED state. The arrival of packet 2, at a power level of −25 dBm, will increase the total power of the system by barely 0.01 dB, thus the high threshold will not be exceeded, keeping the OAGC in the LOCKED state. Therefore, packet 2 will also receive a downward attenuation of 30 dB, resulting in a power level of −55 dBm. The power level of packet 2 is now below the minimum decodable level and will therefore need a further adjustment in the individual channel with use of the IAGC. Although packet 2 is below the minimum decodable level, the IAGC will still be able to boost the signal up to the acquisition level. Signals coming in below the minimum decodable level will be adjusted in gain, or boosted up into the spare range, while the noise associated with the signal will also be boosted. A modem in such a case may not have the signal to noise (SNR) capabilities to decode the signal.

The amount of headroom budgeted for the system must also be put into consideration. For example, consider if 15 packets arrived at the same time, all at the acquisition level (−30 dBm). Although no gain would be needed, the system would see an overall power level of −18.24 dBm. Thus, the headroom must be set at a level greater than −18.24 dBm in order to accommodate the incoming signal. For the above mentioned reasons it is also useful to statistically examine the range incoming signals are likely to fall.

This invention is applicable to any communications systems that supports two or more concurrent physical layer channels and minimizes the need for mid-packet gain adjustments. Although the channels discussed in this application are separated in frequency to illustrate the key concepts of the invention, it should be appreciated that the channels may be separable along other dimensions.

Furthermore, although an analog OAGC was considered, it is conceivable that the OAGC could be fully digital in those communications systems that utilize this invention to minimize the digital word-length (which is analogous to ADC dynamic range). Therefore, all controllers described herein may be analog or digital controllers and use proportional, integral, and differential (PID) controllers, state-space controllers, or other forms of control known in the art.

While this invention has been particularly shown and described with references to preferred embodiments thereof, it will be understood by those skilled in the art that various changes in form and details may be made therein without departing from the scope of the invention encompassed by the appended claims.

What is claimed is:

1. A multi-channel receiver comprising:
   an outer programmable gain controller controlling gain of a multi-channel signal prior to said multi-channel signal being split into a plurality of individual channels; and
   a plurality of inner programmable gain controllers, each inner gain controller controlling gain of one of said individual channels,
   wherein the outer gain controller receives feedback identifying if a packet is being processed on any of said individual channels and controls the gain of the multi-channel signal at a fixed nominal gain if a packet is being processed on one of said individual channels.

2. The multi-channel receiver of claim 1, further comprising an analog to digital converter to digitize the gain controlled multi-channel signal and wherein each channel further comprises a digital filter.

3. The multi-channel receiver of claim 1, wherein the feedback is provided by a modem operable to demodulate one of the individual channels and the feedback identifies if a packet is being processed by the modem.

4. The multi-channel receiver of claim 3, wherein the feedback is provided by a plurality of modems, each modem operable to demodulate one of the individual channels; wherein the feedback identifies if a packet is being processed by any of the modems.

5. The multi-channel receiver of claim 1, wherein the feedback is provided by an analyzer.

6. The multi-channel receiver of claim 1, wherein the outer gain controller controls the gain of the multi-channel signal at the fixed nominal gain while an acquisition threshold power level is not exceeded.

7. The multi-channel receiver of claim 6, wherein once the acquisition threshold power level or a high threshold power level is exceeded, the outer gain controller adjusts the fixed nominal gain such that a total power is brought below the acquisition threshold.

8. The multi-channel receiver of claim 7, wherein the outer gain controller waits until no packets are being processed on any of said individual channels prior to adjusting the fixed nominal gain.

9. The multi-channel receiver of claim 1, wherein the inner gain controller adjusts a gain when an input signal to said inner gain controller differs from a predetermined reference level.

10. The multi-channel receiver of claim 1, wherein the outer programmable gain controller is an analog gain controller.

11. The multi-channel receiver of claim 1, wherein the inner programmable gain controller is a digital gain controller.

12. A method of automatic gain control for multi-channel communications comprising:
    automatically controlling gain of a multi-channel signal with an outer programmable gain controller, prior to said multi-channel signal being split into a plurality of individual channels;
    automatically controlling gain of said individual channels with a plurality of inner programmable gain controllers; and
    receiving feedback identifying if a packet is being processed on any of said individual channels;
    wherein the controlling gain of the multi-channel signal is at a fixed nominal gain if a packet is being processed on one of said individual channels.

13. The method of claim 12 further comprising:
    digitizing the gain controlled multi-channel signal with an analog to digital converter, wherein each channel further comprises a digital filter.

14. The method of claim 12 wherein the controlling gain of the multi-channel signal at the fixed nominal gain occurs while an acquisition threshold power level is not exceeded; and
    adjusting the fixed nominal gain, if the acquisition threshold power level or a high threshold power level is exceeded, such that a total power is brought below the acquisition threshold.

15. The method of claim 14 further comprising: waiting until no packets are being processed on any of said individual channels prior to adjusting the fixed nominal gain.

16. The method of claim 12 further comprising:
    adjusting a gain, with the plurality of inner gain controllers, when an input signal to said inner gain controller differs from a predetermined reference level.

17. The method of claim 12, wherein the automatically controlling gain of a multi-channel signal further comprises:
    controlling an analog gain with the outer programmable gain controller.

18. The method of claim 12, wherein the automatically controlling gain of a individual channels further comprises:
    controlling a digital gain with the inner programmable gain controller.

19. The method of claim 12 further comprising demodulating each of said individual channels after the automatically controlling gain of said individual channels with a plurality of modems; and wherein the feedback identifies if a packet is being processed by any of the modems.

20. A multi-channel receiver comprising:
    an attenuation gain control means for adjusting gain for a multi-channel signal, prior to said multi-channel signal being split into a plurality of individual channels;
    a plurality of gain control means for individually adjusting gain of said individual channels of the multi-channel signal; and
    a plurality of feedback mechanisms providing feedback to the attenuation gain control means, the feedback identifying if a packet is being processed on any of said individual channels;
    wherein the attenuation gain control means adjusts gain for the multi-channel signal at a fixed nominal gain if a packet is being processed on one of said individual channels.

21. A multi-channel receiver comprising:
    an outer variable gain amplifier that receives a multi-channel input signal;
    an outer analog gain controller that controls the gain applied to the multi-channel input signal;
    an analog to digital converter that digitizes the multi-channel input signal after gain adjustment;
    a plurality of band pass filters, said filters receiving the digitized multi-channel signal and each filter outputting an individual channel;
    a plurality of inner variable gain amplifiers, each receiving a respective individual channel;
    a plurality of inner digital gain controllers, each controlling the gain applied to a respective individual channel; and
    a plurality of feedback mechanisms providing feedback to the outer analog gain controller, the feedback identifying if a packet is being processed on any of said individual channels;

wherein the outer analog gain controller controls the gain applied to the multi-channel input signal at a fixed nominal analog gain if a packet is being processed on one of said individual channels.

22. The multi-channel receiver of claim 21, wherein the plurality of feedback mechanisms are modems, each of the modems operable to demonstrate one of the individual channels; wherein the feedback identifies if a packet is being processed by any of the modems.

23. The multi-channel receiver of claim 21, wherein the plurality of feedback mechanisms are end point analyzers.

24. The multi-channel receiver of claim 21, wherein the outer gain controller controls the gain applied to the multi-channel signal at the fixed nominal analog gain while an acquisition threshold power level is not exceeded.

25. The multi-channel receiver of claim 24, wherein once the acquisition threshold power level or a high threshold power level is exceeded, the outer gain controller adjusts the analog gain such that a total power is brought below the acquisition threshold.

26. The multi-channel receiver of claim 25, wherein the outer gain controller waits until no packets are being processed on any of said individual channels prior to adjusting the analog gain.

27. The multi-channel receiver of claim 21, wherein the inner gain controller adjusts a digital gain when an input signal to said inner gain controller differs from a predetermined reference level.

* * * * *